(12) United States Patent
Kienzle (10) Patent No.: US 12,117,505 B2
(45) Date of Patent: Oct. 15, 2024

(54) SENSOR DEVICE WITH SENSOR AND CURRENT CONVERTER

(71) Applicant: Robert Bosch GmbH, Stuttgart (DE)

(72) Inventor: Ralf Kienzle, Korntal-Muenchingen (DE)

(73) Assignee: Robert Bosch GmbH, Stuttgart (DE)

( * ) Notice: Subject to any disclaimer, the term of this patent is extended or adjusted under 35 U.S.C. 154(b) by 193 days.

(21) Appl. No.: 17/762,135

(22) PCT Filed: Sep. 16, 2020

(86) PCT No.: PCT/EP2020/075800
§ 371 (c)(1),
(2) Date: Mar. 21, 2022

(87) PCT Pub. No.: WO2021/052979
PCT Pub. Date: Mar. 25, 2021

(65) Prior Publication Data
US 2022/0373617 A1    Nov. 24, 2022

(30) Foreign Application Priority Data

Sep. 20, 2019  (DE) .................... 10 2019 214 325.3
Sep. 15, 2020  (DE) .................... 10 2020 211 526.5

(51) Int. Cl.
*G01R 33/00*    (2006.01)
*G01R 19/00*    (2006.01)
(Continued)

(52) U.S. Cl.
CPC ..... *G01R 33/0017* (2013.01); *G01R 19/0092* (2013.01); *G01R 33/0011* (2013.01); *G01R 33/072* (2013.01); *H02M 1/0009* (2021.05)

(58) Field of Classification Search
USPC ....................................... 324/117 H
See application file for complete search history.

(56) References Cited

U.S. PATENT DOCUMENTS 8,810,235 B2 *  8/2014  Ueno ................... G01R 15/207
324/253
2006/0232902 A1   10/2006  Woolsey et al.
(Continued)

FOREIGN PATENT DOCUMENTS

FR      2293831 A1    7/1976

OTHER PUBLICATIONS

Translation of International Search Report for Application No. PCT/EP2020/075800 dated Dec. 15, 2020 (2 pages).

*Primary Examiner* — Vincent Q Nguyen
(74) *Attorney, Agent, or Firm* — Michael Best & Friedrich LLP (57) ABSTRACT

A sensor device having a sensor, having a circuit carrier, having conductor sections which serve for supplying electrical current to the sensor and for detecting an output signal ($U_H$) generated by the sensor and by which the sensor is connected to the circuit carrier, and having a supply and read-out device, wherein respective contact points of two of the conductor sections on the circuit carrier are electrically connected by a capacitor ($C_1$) such that the two conductor sections, the capacitor ($C_1$) and the sensor form constituent parts of an electrical loop ($L_1$), and to a current converter and to the use of such a sensor device.

15 Claims, 6 Drawing Sheets

(51) Int. Cl.
    *G01R 33/07*    (2006.01)
    *H02M 1/00*     (2007.01)

(56) References Cited

U.S. PATENT DOCUMENTS

| | | |
|---|---|---|
| 2009/0039880 A1 | 2/2009 | Nomura et al. |
| 2015/0043254 A1* | 2/2015 | Preckwinkel ....... H02M 7/5395 363/41 |
| 2016/0011241 A1 | 1/2016 | Phillips et al. |
| 2018/0084681 A1* | 3/2018 | Guo ................... G01R 33/0017 |
| 2020/0132736 A1* | 4/2020 | Fujioka ................. G01R 19/25 |

* cited by examiner

SENSOR DEVICE WITH SENSOR AND CURRENT CONVERTER

BACKGROUND OF THE INVENTION

The present invention relates to a sensor device having a sensor, to a current converter having such a sensor device and to a use of such a sensor device.

Current converters are used to control and/or operate electrical machines in hybrid or electric vehicles, for example, and are generally suitable and configured to operate the electrical machine in a motor mode and a generator mode, depending on the current requirements. A synchronous machine, for example, is operated with three-phase current, with the result that three phase lines are provided between a corresponding interface in the current converter (also referred to as inverter) and the electrical machine. The currents of and/or in the phase lines must generally be measured in order to control the electrical machine.

A current measurement required for this purpose may be carried out, for example, according to the conventional principle of a current sensor, in which a Hall sensor dips into the air gap of a so-called flux concentrator. The flux concentrator (which is typically composed of ferromagnetic material or has such a material) has the task in this case of focusing, amplifying and homogenizing the magnetic field generated by the current, for example in a phase line (or naturally also in another manner), with the result that the Hall sensor can provide values which are as accurate as possible.

In this case, the Hall sensor may be connected to a printed circuit board or generally to the circuit carrier via a row of pins (in a so-called SIP or Single In-Line Package). Increasingly higher intermediate circuit voltages and faster switching operations in the current converter result in greater interference which has hitherto not yet been considered and is undesirable. In particular, an area which is permeated by the magnetic field lines of the magnetic field to be measured is stretched between conductor sections used to connect the Hall sensor to the printed circuit board (for example the two supply pins). A voltage is induced in this area in the case of a temporally variable magnetic flux, generally caused by a temporally variable magnetic field. In this case, the magnitude of this voltage is proportional to the size of the permeated area, the strength of the magnetic field and the frequency of the signal.

The currents which typically need to be measured themselves usually do not have any very high frequencies; these are less than 10 kHz, for example. However, during each switching operation of the power electronics in the current converter, the charge of parasitic capacitances must be reversed (for example a shielding capacitance of phase lines and/or a capacitance of the load or of the electrical machine with respect to the housing or ground). The necessary current also flows through the phase lines. The resulting magnetic field not only permeates the Hall sensor, but may also permeate further areas between the conductor tracks and may induce a relevant interference voltage between the sensor pins at frequencies of more than 1 MHz, for example.

If there is low attenuation, the result is an oscillation process which can have a higher frequency, for example more than 1 MHz. The greater the capacitance and the greater the intermediate circuit voltage which are switched to the capacitance during the switching operation, the greater the resulting current amplitude of the oscillation process. Depending on attenuation, the oscillation process may comprise only a few periods (for example fewer than five) or a relatively large number of periods (for example more than 20) until it has decayed to small values.

This voltage which is induced on account of the higher-frequency oscillation process between two conductor sections of the Hall sensor is therefore modulated onto the supply voltage of the Hall sensor. As a result, the Hall sensor possibly reacts with an interference signal which is not without mean values on the output pin (that is to say a connection for capturing the voltage induced in the Hall sensor, the Hall voltage) over a certain time (typically a few microseconds after the switching operation) and the voltage signal which is to be read in and should correspond to the level of the current to be measured is or has been distorted.

SUMMARY OF THE INVENTION

The invention proposes a sensor device having a sensor, a current converter and a use of a sensor device.

The invention relates to a sensor device having a sensor, a circuit carrier, conductor sections for supplying current to the sensor and for capturing an output signal generated by the sensor, which conductor sections are used to connect the sensor to the circuit carrier, and a supply and read-out apparatus. The supply and read-out apparatus, which may also be arranged on the circuit carrier, is used in this case, in particular, to supply current or voltage to the sensor and to capture and also read out and possibly evaluate the output signal output by the sensor, in particular a voltage or current signal. The conductor sections may also comprise in this case, in particular, any pins on the sensor or a housing of the sensor.

Such a sensor device is initially used primarily to measure any desired measurement variable, for example a current. However, the measurement may be negatively affected by magnetic fields, in particular during current measurements (and also directly during magnetic field measurements), as explained above. Therefore, in the case of current sensors and magnetic field sensors, for example Hall sensors or sensors based on AMR ("Anisotropic Magneto Resistance"), GMR ("Giant Magneto Resistance"), TMR ("Tunnel Magneto Resistance"), IMC ("Integrated Magnetic Concentrator") or other magnetoresistive effects, the invention exhibits particular advantages, in particular in the case of those in which a current change or possibly a magnetic field change is mapped to an (in particular linear) voltage change at the output of the sensor.

The sensor device preferably also has an, in particular annular, flux concentrator which is expediently composed of a ferromagnetic material or has such a material, having a gap, wherein the sensor, which is then a magnetic field sensor in particular, is arranged in the gap, to be precise expediently in such a manner that the magnetic field lines present in the gap are oriented perpendicular to a sensor plane of the—typically flat—sensor. In this manner, the sensor device can also be used to measure a current through one conductor, for example, as mentioned above with respect to a phase current in an electrical machine. Irrespective of this, the principle on which the present invention is based does not depend, however, on how high-frequency interference of the magnetic field, which permeates the sensor, arises.

In the proposed sensor device, respective contact points of two of the conductor sections on the circuit carrier are now electrically connected by means of a capacitor (and, in particular, also by means of appropriate connection lines from the contact points to the capacitor), with the result that the two conductor sections, the capacitor and the sensor are constituent parts of an electrical loop. In this case, these constituent parts may belong to a common, first electrical loop or may belong to two different electrical loops, as explained in yet more detail below. In the case of a common electrical loop, the first electrical loop then comprises the conductor sections, the contact points and the capacitor and, in particular, also the sensor itself or a part of the latter. In this case, a contact point of a conductor section on the circuit carrier should be understood as meaning, in particular, a position on the circuit carrier at which the conductor section is electrically and/or mechanically connected to the circuit carrier—and there then to corresponding further conductors—for example solder points.

In this manner, that is to say by virtue of the capacitor which (directly) connects the contact points, expediently below the housing, an area which is as small as possible and is permeated by the magnetic field can be achieved in a particularly simple and cost-effective manner between two pins of the housing or two conductor sections (electrical loop). This in turn results in high-frequency interference in the magnetic field having less influence, that is to say resulting in a lower interference voltage that is modulated onto a (supply) voltage applied to the conductor sections.

A sensor like in the sensor device mentioned may have, for example, four conductor sections of this type (which also comprise corresponding pins on the sensor or on the housing of the latter), two of which are used to supply the current to the sensor and another of which (usually together with the ground conductor section of the supply) is used to capture the output signal. In this case, the fourth pin or conductor section usually performs a special function. However, it is also conceivable for only three or more conductor sections to be provided; for example, one conductor section may be used both to supply current and to capture the voltage, as just mentioned.

Which two of these conductor sections are then constituent parts of the electrical loop can fundamentally be selected depending on requirements. It is also conceivable and sometimes also particularly advantageous if a plurality of pairs of conductor sections are each a constituent part of a respective electrical loop with a respective capacitor.

It is conceivable, for example, for the two conductor sections (which are constituent parts of the electrical loop) to be used to supply current to the sensor. However, it is likewise also conceivable that, of the two conductor sections, one is used to supply current to the sensor and one is used to capture the output signal generated by the sensor.

The first electrical loop, at least insofar as it is formed on the circuit carrier, is preferably designed in such a manner that it encloses an area which is as small as possible. As far as the part of the electrical loop on the circuit carrier is concerned, this means, in particular, that the shortest possible (electrical and geometric) connection between the two contact points of the conductor sections should be selected. This may be a linear connection, for example.

In this respect, it is also expedient for the capacitor on the circuit carrier to be geometrically arranged between the respective contact points. This results—in particular if the shape of the sensor device is retained outside the circuit carrier—in the area permeated by the magnetic field being as small as possible, especially since the electrical loop is separated from other constituent parts by the capacitor. The above-mentioned arrangement of the capacitor means—in terms of geometry—an arrangement of the capacitor directly below the sensor or any housing of the sensor. Although the areal portions are then still present, they are separated on account of the capacitor. The capacitor supports the voltage, with the result that the influence of the connected lines (not of the sensor) becomes lower.

If the two conductor sections, between which the capacitor is provided, are used to supply current to the sensor, this capacitor may be simultaneously used as a back-up capacitor. As a result of the above-mentioned (direct) connection of the contact points and, in particular, the arrangement of the capacitor below the sensor or in such a manner that the area of the electrical loop is as small as possible, influence of high-frequency interference in the magnetic field can then be reduced.

It is particularly preferred if the sensor device has a second electrical loop which is electrically connected to the capacitor and is designed in such a manner that a current flow, which is generated in the second electrical loop by a magnetic field that permeates the first electrical loop and the second electrical loop at the same time, counteracts, that is to say reduces, interference exerted on the output signal from the sensor by the magnetic field. This can be achieved, for example, by virtue of the current flow, in particular a (high-frequency) AC component, which is generated by the magnetic field in the first electrical loop, being counteracted in the second electrical loop. However, it should be noted that such a sensor may fundamentally have a very complex structure and all conductor sections may have an effect, which possibly also results in it being necessary to increase the voltage in the conductor sections for supplying current in order to reduce the interference in the output signal. In this sense, this would therefore possibly mean that the current flow which is generated by the magnetic field in the first electrical loop is amplified in the second electrical loop. This second electrical loop expediently comprises a further capacitor in order to avoid any short circuits.

According to the law of induction and if a constant geometry of the electrical loop is assumed, such a current flow is caused in this case only by a (temporally) changing magnetic field and therefore has (high-frequency) AC components, in particular.

In this respect, it should be noted that, as a result of the above-mentioned connection of the second electrical loop to the capacitor and therefore also to the first electrical loop, both current flows or the charge transfers caused by magnetic fields are superimposed, in particular at nodes between the two loops. The result may be influenced, for example, by a phase offset of the current flow generated in the second electrical loop with respect to the current flow generated in the first electrical loop. For this purpose, impedances (for example inductances), in particular, may be provided in the second electrical loop and are selected in such a manner that the interference in the output signal from the sensor becomes lower.

It may also be expedient if the second electrical loop is electrically connected to the capacitor in such a manner that a direction of the current flow into the capacitor from the further electrical loop has a phase offset of a value between 0° and 360°, for example 180°, with respect to the direction of the current flow into the capacitor from the first electrical loop. In addition, if necessary, impedances or other passive elements or components may also be provided here. The second electrical loop may generally be adapted to the (first) electrical loop with any components such that the undesirable interference in the Hall voltage is reduced as far as possible.

Since the interference can be reduced very effectively by a second loop, it is also preferred if a first electrical loop comprises the two conductor sections and the sensor, but not the capacitor, and a second electrical loop comprises the connection lines from the contact points to the capacitor and optionally also the capacitor. In this case too, the second electrical loop is then designed in such a manner that a current flow, which is generated in the second electrical loop by a magnetic field that permeates the first electrical loop and the second electrical loop at the same time, counteracts interference exerted on the output signal from the sensor by the magnetic field. The electrical lines may then cross at one or more points, for example, thus resulting in a transition from the first to the second electrical loop.

In this case, the second electrical loop may comprise the (then possibly only) capacitor which can then be used as a back-up capacitor—depending on the situation—as already described above. However, it is also conceivable that, although the capacitor electrically closes the second electrical loop, it is outside the loop area, that is to say is a constituent part of neither the first nor the second electrical loop, as becomes clear, in particular, on the basis of the following exemplary embodiments in the figures. In principle, the statements made with respect to the above variant with the second electrical loop, that it is thus possible to generate a voltage which counteracts the voltage arising in the first electrical loop and thus reduces the interference, similarly apply here.

It may be expedient if a third electrical loop is also provided and is likewise designed in such a manner that a current flow, which is generated in the second and third electrical loops by a magnetic field that permeates the first, second and third electrical loops at the same time, counteracts interference exerted on the output signal from the sensor by the magnetic field.

The invention also relates to a current converter for an electrical machine, which current converter has at least one sensor device according to the invention and is configured to capture a phase current.

The invention also relates to a use of a sensor device according to the invention for capturing a phase current when operating an electrical machine by means of a current converter.

Further advantages and configurations of the invention emerge from the description and the accompanying drawing.

The invention is schematically illustrated in the drawing on the basis of exemplary embodiments and is described below with reference to the drawing.

DETAILED DESCRIPTION

Figure 1:
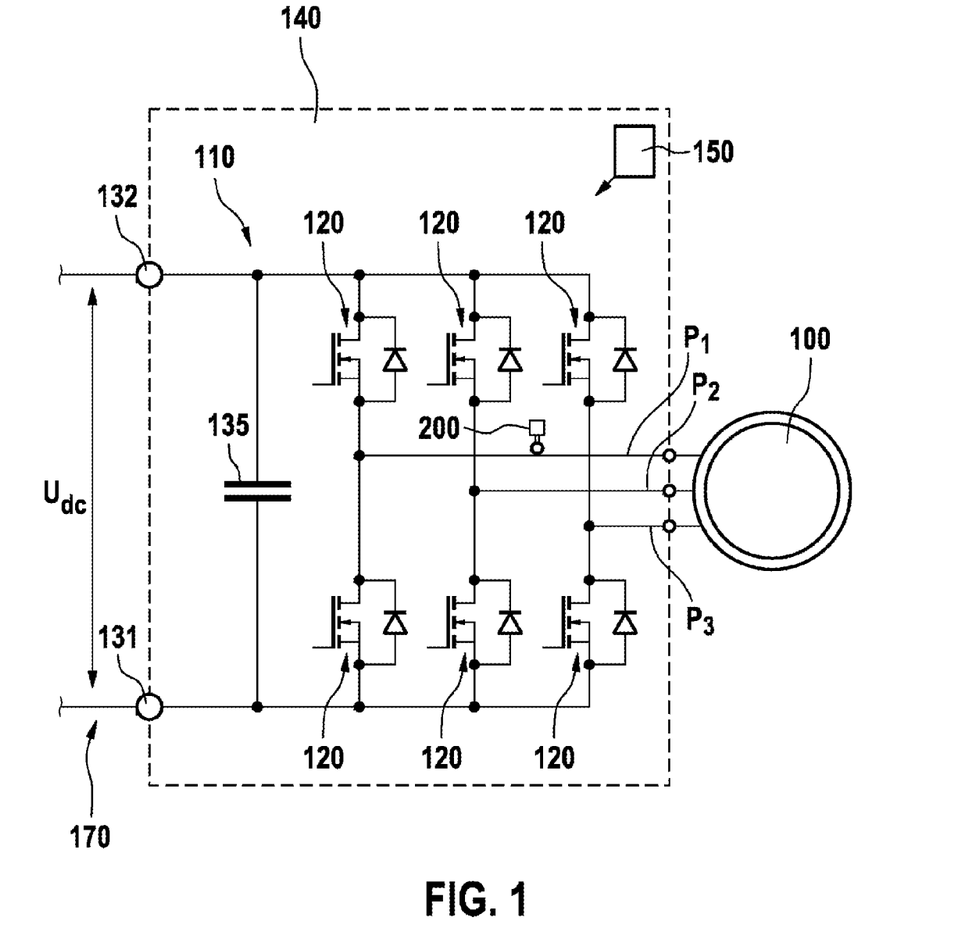
FIG. 1 schematically shows a current converter in which a sensor device according to the invention can be used.

FIG. 1 schematically illustrates a current converter 110 which is in the form of a bridge inverter, for example, in which a sensor device according to the invention can be used and which is used to control an electrical machine 100.

The current converter 110 has two DC voltage connections 131, 132 which, in addition to an intermediate circuit capacitor 135, are connected in a conventional manner to six semiconductor switches 120, for example MOSFETs, for example. A phase of the electrical machine 100, which is respectively denoted $P_1$, $P_2$ or $P_3$, is connected between two of the semiconductor switches 120 in each case.

It should be mentioned at this point that the current converter cannot only be operated as an inverter but also, in particular, as a rectifier, with the result that the electrical machine as a whole can be operated both in a motor mode and in a generator mode.

The current converter 110 is also connected, by way of its DC voltage connections 131, 132, to a vehicle electrical system 170, for example in a vehicle. Further components or loads, which are not shown here however for the sake of clarity, are in turn typically connected to the vehicle electrical system 170.

During operation of the current converter 110, the individual semiconductor switches 120 are now actuated to open or close in a suitable manner by means of an actuation circuit or an actuation unit 150. During conventional actuation, one switch for each branch is always closed and the other is open, for example. In this case, a DC voltage $U_{dc}$ is converted into an AC voltage.

A preferred embodiment of a sensor device 200 according to the invention, which can be used to capture or measure a phase current, that is to say a current which flows in the phase $P_1$, is also indicated by way of example. It goes without saying that further sensor devices of this type may be provided for the other phases.

In this case, the current converter 110 and the actuation unit 150 may together form power electronics 140 for the electrical machine 100 or may be part of such power electronics. In particular, the sensor device 200 may also be part of the latter.

Figure 2:
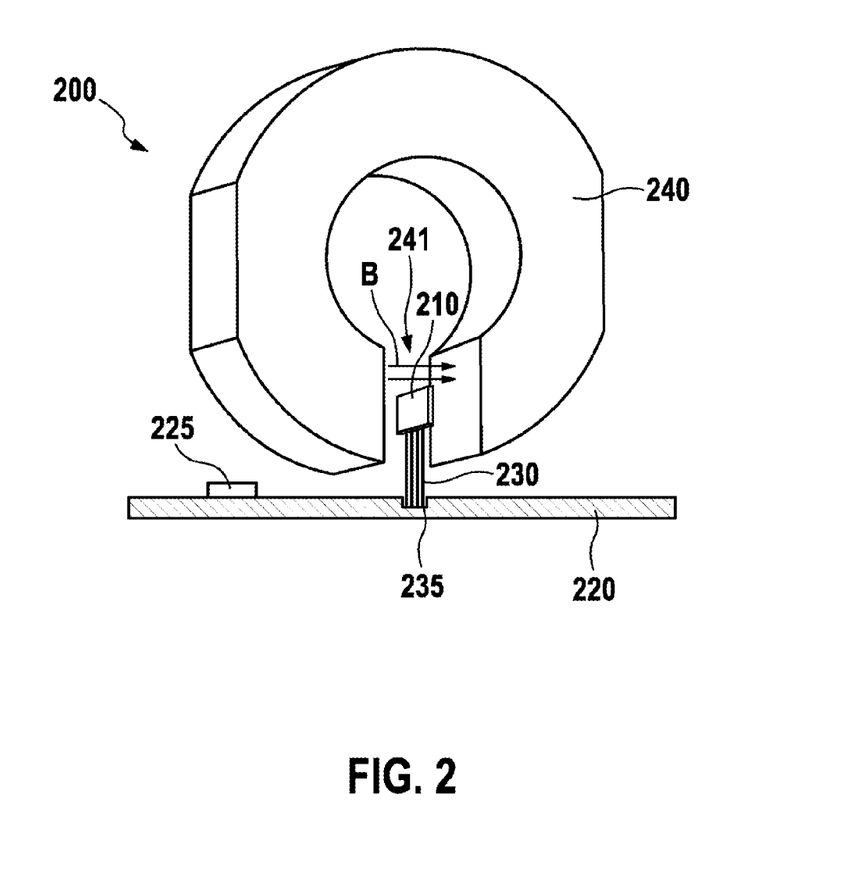
FIG. 2 schematically shows a sensor device according to the invention in one preferred embodiment.

FIG. 2 schematically illustrates a sensor device 200 according to the invention in one preferred embodiment. The sensor device 200 has, for example, a sensor 210 which is in the form of a Hall sensor here and is connected and fastened in an electrically conductive manner at a respective contact point, one of which is denoted 235, by means of conductor sections, one of which is denoted 230, on a printed circuit board 220 as a circuit carrier.

The conductor sections are used to supply current to the Hall sensor 210 and to capture a Hall voltage generated by the Hall sensor 210, as will be explained in yet more detail below, specifically, for example, by means of a supply and read-out apparatus 225 which is arranged on the printed circuit board 220 and is appropriately electrically connected.

The sensor device 200 also has a flux concentrator 240 which is annular here and is composed of a ferromagnetic material, for example iron, and has a gap 241. The Hall sensor 210 is arranged in this gap 241 in which flux lines of a magnetic field B, which forms in the flux concentrator if a current flows in a line routed through the central opening of the flux concentrator 240 for example, form in a particularly rectilinear manner. In this manner, such a magnetic field can be captured in a particularly simple and accurate manner, in principle.

It should also be recognized that, in the case of such a sensor device having a Hall sensor and a flux concentrator, the conductor sections are also located in the magnetic field B, but the magnetic field B also likewise permeates the printed circuit board 220 (albeit possibly to a lesser extent).

Figure 3:
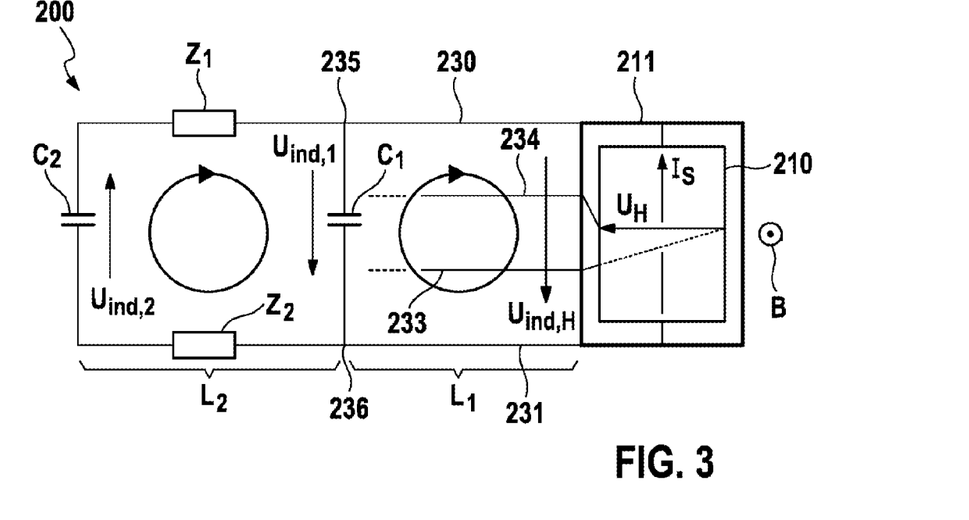
FIG. 3 schematically shows a sensor device according to the invention in a further preferred embodiment.

FIG. 3 schematically shows a sensor device 200 according to the invention in a further preferred embodiment, specifically as a circuit diagram. This may also be the sensor device shown in FIG. 2.

The Hall sensor 210 arranged in a housing 211 is connected to the printed circuit board 220 by means of four conductor sections 230, 231, 233 and 234, for example. In this case, the conductor sections 230 and 231 are used to supply current to the Hall sensor 210, that is to say a current flow $I_s$ can be applied through or to the Hall sensor 210 via said conductor sections (and with the supply and read-out apparatus shown in FIG. 2).

The conductor section 233 or 234 (together with that conductor section of the supply which is connected to ground) is used to capture a Hall voltage $U_H$ which is generated in the presence of a magnetic field B and the current $I_s$. It goes without saying that, in the case of a different type of sensor, an output signal other than the Hall voltage is also present. Irrespective of the type of sensor, processing of the output signal is then generally also provided, with the result that, for example, a digitally generated, ratiometric signal with a center voltage of 2.5 V is output. The supply and read-out apparatus, which is not shown here for the sake of clarity, can then likewise be used to read out and evaluate the Hall voltage $U_H$.

A capacitor $C_1$ which is also used here as a back-up capacitor is connected between two contact points 235 and 236, at which the conductor sections 230 and 231 are connected to the printed circuit board (not shown here) (these are therefore feed-in points of the supply, based on the sensor, for example). This forms a (closed) first electrical loop $L_1$ which comprises the capacitor $C_1$, the conductor sections 230 and 231 and parts of the Hall sensor 210.

A second electrical loop $L_2$ is also provided, which second electrical loop comprises a further capacitor $C_2$ and two impedances $Z_1$ and $Z_2$ and is electrically connected to the capacitor $C_1$. In this case, the second electrical loop $L_2$ is formed on the printed circuit board, for example using suitable conductor tracks (for example made of copper). In this respect, it should be noted that, although the electrical loops $L_1$ and $L_2$ are in a plane in the illustration shown, the first electrical loop $L_1$ is approximately at an angle of 90° with respect to the second electrical loop $L_2$ in the actual embodiment, as is clear from FIG. 2. In this case, the second electrical loop $L_2$ may be formed on the left-hand side or right-hand side with respect to the conductor sections or contact points.

The selected area of the second electrical loop $L_2$ on the printed circuit board and the area between the two conductor sections 230, 231 (those for supplying current in this example) are permeated by the magnetic field B. Induction voltages $U_{ind,1}$ and $U_{ind,2}$ are dropped across the capacitors $C_1$ and $C_2$ and across the impedances. An induction voltage $U_{ind,H}$ is dropped across the supply connections of the Hall sensor. This is indicated by means of the circular arrows.

In this case, the capacitor $C_1$ can be used to support the supply voltage for the Hall sensor. In addition, the area of the first electrical loop $L_1$, in which a parasitic interfering voltage is induced in the case of high-frequency magnetic fields, is kept as small as possible between the conductor sections by arranging the capacitor $C_1$ as directly as possible below the Hall sensor on the printed circuit board.

The induced interference voltages $U_{ind,1}$ and $U_{ind,H}$ are therefore also kept as low as possible. As already mentioned, it should be ensured here that the capacitor $C_1$ should be fitted as directly as possible below the Hall sensor 210 or its housing 211 (at the level of the contact point 235 in FIG. 2).

The further capacitor $C_2$ in the second electrical loop $L_2$ is used to avoid a short circuit on the supply lines or other pins or conductor sections which are intended to be influenced. The impedances $Z_1$ and $Z_2$ can be used to provide additional passive components in order to generate an impedance in the second electrical loop $L_2$ which favorably influences a phase and/or amplitude of the voltage $U_{ind,1}$ and thus the current flow caused thereby.

The amplitude, phase and possibly a frequency (that is to say the natural resonance of the electrical loop) of the induced voltage at the capacitor $C_1$, that is to say $U_{ind,1}$ can be set in such a manner that the erroneous reaction of the Hall sensor to the interfering (high-frequency) magnetic field is reduced. In other words, the second electrical loop $L_2$ is therefore formed in such a manner that a current flow (or a charge transfer), which is generated in the second electrical loop $L_2$ by a magnetic field B that permeates both electrical loops at the same time, counteracts interference exerted on the output signal from the sensor by the magnetic field (B).

In this case, a voltage is induced on account of the law of induction. Initially, these voltages are not dropped across the capacitances, but rather across the inductances (each area always has an inherent inductance, irrespective of the components). Current flows which give rise to charge transfers in the capacitors only then build up. As a result, the voltages across the capacitors change (if the capacitor is large, its voltage change is small). It is therefore possible to refer to induced voltages at the capacitors.

Generally, these need not be the supply pins or conductor sections for supplying current to the Hall sensor; other signals or pins or conductor sections may also be provided with a loop, as described.

Figure 4:
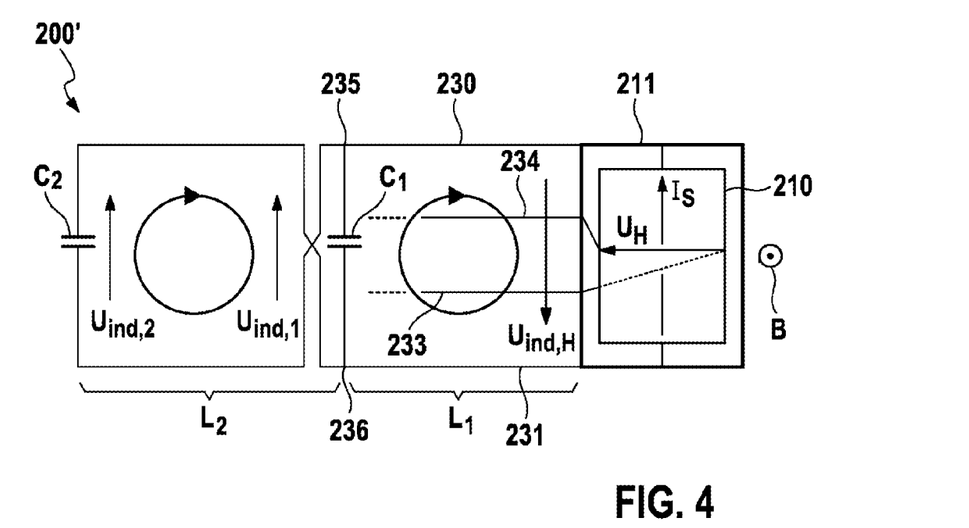
FIG. 4 schematically shows a sensor device according to the invention in a further preferred embodiment.

FIG. 4 schematically illustrates a sensor device 200' according to the invention in a further preferred embodiment, likewise as a circuit diagram. The sensor device 200' largely corresponds to the sensor device 200, with the result that reference can be made to the statements there.

In contrast to the embodiment according to FIG. 3, the second electrical loop $L_2$ is electrically connected to the capacitor $C_1$ in a crossed manner here, with the result that the phase angle of the voltage $U_{ind,1}$ is rotated through 180°. Impedances, like in FIG. 3, could also be provided here, if necessary or desired. The induced rotational voltage in the area of the second loop $L_2$ rotates or shifts the components through 180°. This means that any previous amplification of output interference can now result in attenuation, specifically on account of the 180° shift. At this point, however, it should be mentioned that the value of 180° is used here purely by way of example and for explanation.

Depending on the internal behavior and structure of the generally complex sensor device or of a corresponding sensor chip, different variants of an electrical loop, as explained above using examples, can be used to improve the measurement signal.

Figure 5:
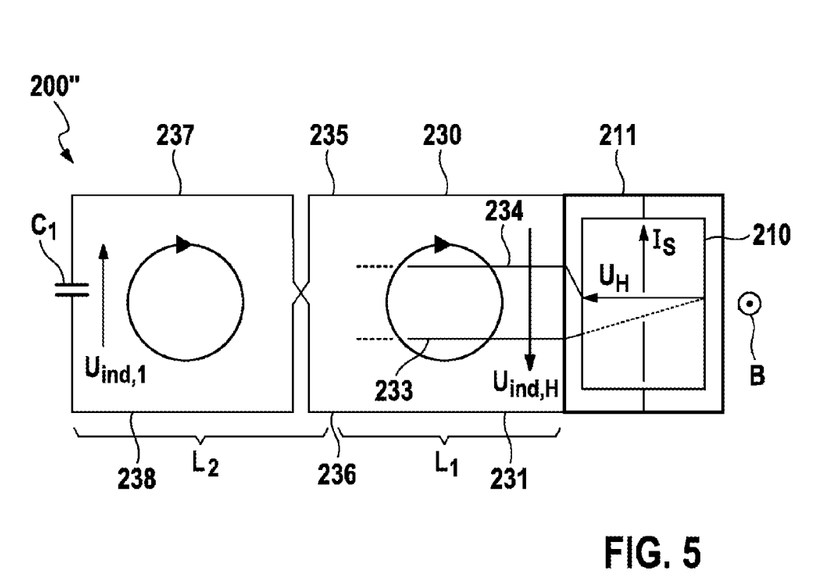
FIG. 5 schematically shows a sensor device according to the invention in a further preferred embodiment.

FIG. 5 schematically illustrates a sensor device 200" according to the invention in a further preferred embodiment, likewise as a circuit diagram. The sensor device 200" largely corresponds to the sensor device 200', with the result that reference can be made to the statements there.

In contrast to the embodiment according to FIG. 4, however, the second electrical loop $L_2$ is arranged directly downstream of the first electrical loop here and the capacitor $C_1$ is—in addition to connection lines 237, 238 from the contact points 235, 236 to the capacitor $C_1$—a constituent part of the second electrical loop, wherein the phase angle of the voltage $U_{ind,1}$ is also shifted here with respect to the voltage $U_{ind,H}$. Impedances, like in FIG. 3, could also be provided here, if necessary or desired.

In other words, the capacitor $C_1$ shown in FIG. 4 is missing in the embodiment according to FIG. 5 and the capacitor $C_2$ there instead undertakes its function. Therefore, the area of the first electrical loop $L_1$ (comprising the sensor) should be delimited by the conductors, for example by bringing the conductors close together with a subsequent transition to the second electrical loop $L_2$ which has the task of compensating for the induced voltage of the first area by means of the opposed rotational voltage. In this case, the second area of the second electrical loop need not be symmetrically divided between both conductors, but rather can also be implemented in various ways using only one conductor, for example, as also shown by way of example below.

The (single) capacitor $C_1$ then has the task of the back-up capacitor for the supply voltage and has the task of the filter capacitor for the output voltage (depending on which conductor sections are a constituent part of the loop).

The induced rotational voltage in the area of the second loop $L_2$ rotates or shifts the components through 180°. This means that any previous amplification of output interference can now result in attenuation, specifically on account of the 180° shift. However, it should be mentioned at this point that the value of 180° is used here purely by way of example and for explanation.

Depending on the internal behavior and structure of the generally complex sensor device or of a corresponding sensor chip, different variants of an electrical loop, as explained above using examples, can be used to improve the measurement signal.

Further examples of this type are schematically shown in FIGS. 6 to 11, wherein only a few of the components are denoted. In particular, possible ways of configuring the second electrical loop, and possibly a third electrical loop, also taking into account the positioning of the capacitor $C_1$, are intended to be shown on the basis of the following exemplary embodiments. In this case, as in the preceding examples as well, the first electrical loop is formed between the two conductor sections 230, 231. As mentioned, it may also be formed between other conductor sections.

Figure 6:
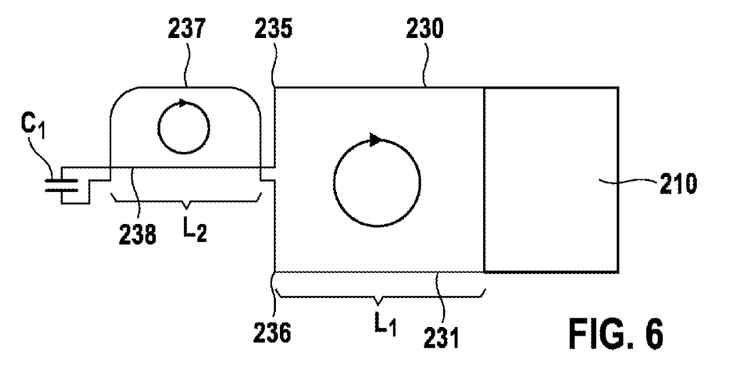
FIGS. 6 to 11 schematically show sensor devices according to the invention in various further preferred embodiments.

The second area of the second electrical loop $L_2$ should expediently always be close to the sensor or Hall sensor 210 so that the magnetic field is large enough for this second area. The second area should be as large as the first area of the first electrical loop $L_1$ if possible. However, there is also a positive effect even in the case of smaller areas. In this respect, FIG. 6 shows an example in which the second electrical loop is formed in such a manner that its (second) area is smaller than the (first) area of the first electrical loop $L_1$. In this case, the second electrical loop is substantially formed by the connection line 237. In addition, the capacitor $C_1$ is not a constituent part of the second electrical loop $L_2$, which is insignificant for the functionality of both the second electrical loop $L_2$ and the capacitor $C_1$.

Figure 7:
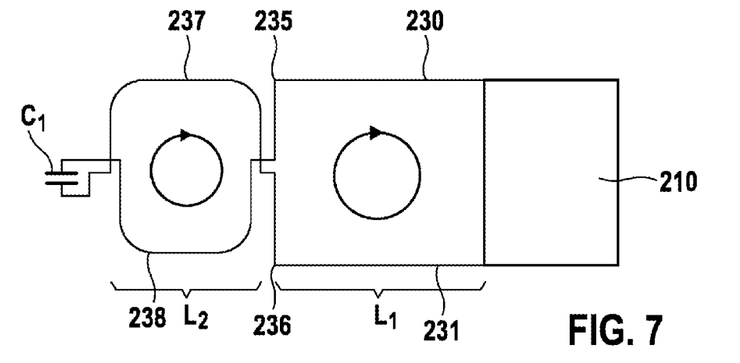

In the example in FIG. 7, the second electrical loop $L_2$ is formed in such a manner that its (second) area corresponds approximately to the (first) area of the first electrical loop $L_1$. In this case, the second electrical loop is substantially formed by the connection lines 237 and 238.

Figure 8:
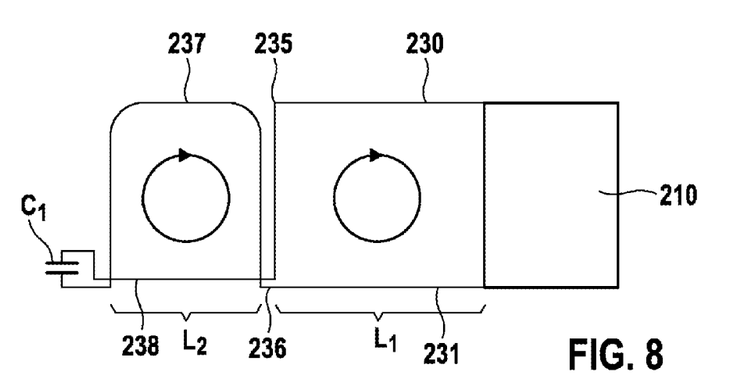

In the example in FIG. 8, the second electrical loop $L_2$ is formed in such a manner that its (second) area corresponds approximately to the (first) area of the first electrical loop $L_1$. In this case, the second electrical loop is substantially formed by the connection line 237.

Figure 9:
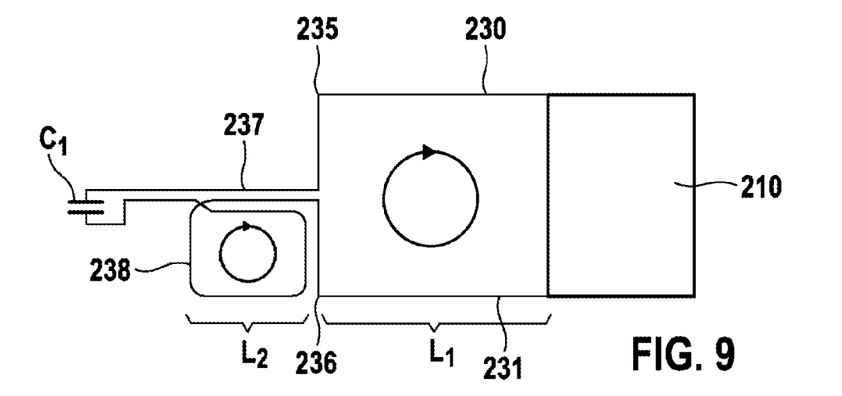

In the example in FIG. 9, the second electrical loop $L_2$ is formed in such a manner that its (second) area is smaller than the (first) area of the first electrical loop $L_1$. In this case, the second electrical loop is substantially formed by the connection line 238. In this case, the connection line 238 is crossed in order to form the loop.

Figure 10:
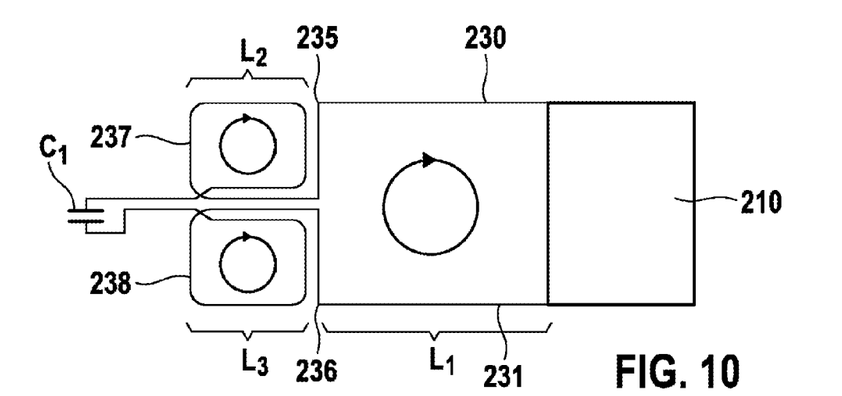

In the example in FIG. 10, a third electrical loop $L_3$ is also provided in addition to the second electrical loop, wherein the second and third electrical loops are each formed in such a manner that their (second or third) area respectively corresponds approximately to half the (first) area of the first electrical loop $L_1$. In this case, the second electrical loop is substantially formed by the connection line 237 and the third electrical loop is formed by the connection line 238. Like in the example in FIG. 9, each of the connection lines 237, 238 is crossed in order to form the respective loop.

Figure 11:
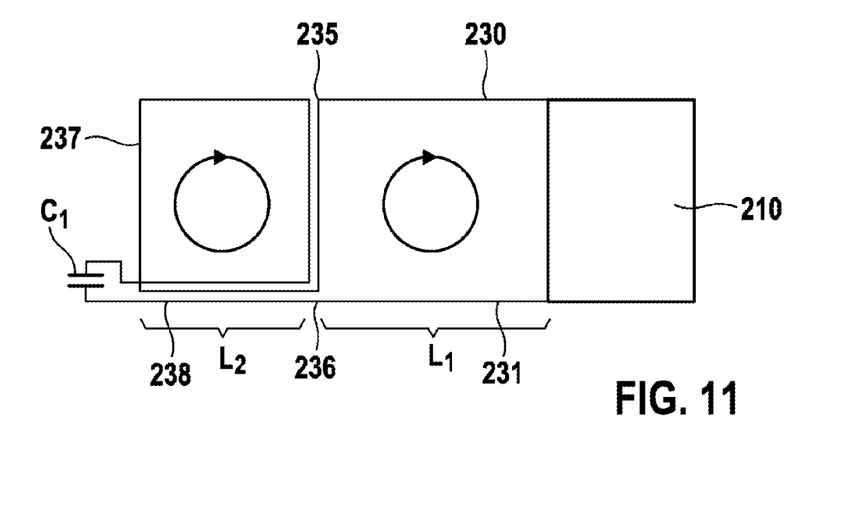

In the example in FIG. 11, the second electrical loop $L_2$ is formed in such a manner that its (second) area corresponds approximately to the (first) area of the first electrical loop $L_1$. In this case, the second electrical loop is substantially formed by the connection line 237. In this case, the connection line 237 is crossed in order to form the loop.

The invention claimed is:

1. A sensor device (200, 200') comprising:
    a sensor (210),
    a circuit carrier (220),
    conductor sections (230, 231, 233, 234) for supplying current to the sensor (210) and for capturing an output signal ($U_H$) generated by the sensor (210), which conductor sections connect the sensor (210) to the circuit carrier (220), and
    a supply and read-out apparatus (225),
        wherein respective contact points (235, 236) of a two of the conductor sections (230, 231) on the circuit carrier (220) are electrically connected together by a capacitor ($C_1$), with the result that the two conductor sections (230, 231), the capacitor ($C_1$) and the sensor (210) are constituent parts of an electrical loop ($L_1$), wherein the two of the conductor sections (230, 231), the capacitor ($C_1$) and the sensor (210) are constituent parts of a common, first electrical loop ($L_1$), and wherein the sensor device further includes a second electrical loop ($L_2$) which is electrically connected to the capacitor ($C_1$) and is designed such that a current flow, which is generated in the second electrical loop ($L_2$) by a magnetic field (B) that permeates the first electrical loop ($L_1$) and the second electrical loop ($L_2$) at the same time, counteracts interference exerted on the output signal from the sensor by the magnetic field (B).

2. The sensor device (200, 200') as claimed in claim 1, wherein the capacitor ($C_1$) is geometrically arranged between the respective contact points (235, 236).

3. The sensor device (200, 200') as claimed in claim 1, wherein the second electrical loop ($L_2$) comprises a further capacitor ($C_2$).

4. The sensor device (200) as claimed in claim 1, wherein the second electrical loop ($L_2$) comprises at least one impedance ($Z_1$, $Z_2$).

5. The sensor device (200') as claimed in claim 1, wherein the second electrical loop ($L_2$) is electrically connected to the capacitor ($C_1$) in such a manner that a direction of the current flow into the capacitor ($C_1$) from the second electrical loop ($L_2$) has a phase offset of a value between 0° and 360° with respect to a direction of the current flow into the capacitor ($C_1$) from the first electrical loop ($L_1$).

6. The sensor device (200, 200') as claimed in claim 1, wherein the first electrical loop ($L_1$), at least insofar as it is formed on the circuit carrier (220), is designed in such a manner that it encloses an area which is as small as possible.

7. The sensor device (200, 200') as claimed in claim 1, wherein the two conductor sections (230, 231) are used to supply current to the sensor (210).

8. The sensor device as claimed in claim 1, wherein one of the conductor sections is used to supply current to the sensor (210) and a second of the conductor sections is used to capture the output signal generated by the sensor (210).

9. The sensor device (200, 200') as claimed in claim 1, further comprising a flux concentrator (240) made of a ferromagnetic material and having a gap (241), wherein the sensor (210) is arranged in the gap (241).

10. The sensor device (200, 200') as claimed in claim 1, wherein the sensor (210) is in the form of a magnetic field sensor.

11. A current converter (140) for an electrical machine (100), having at least one sensor device (200, 200') as claimed in claim 1, which current converter is configured to capture a phase current.

12. The use of a sensor device (200, 200') as claimed in claim 1 for capturing a phase current when operating an electrical machine (100) by means of a current converter (140).

13. A sensor device (200, 200') comprising:
a sensor (210),
a circuit carrier (220),
conductor sections (230, 231, 233, 234) for supplying current to the sensor (210) and for capturing an output signal ($U_H$) generated by the sensor (210), which conductor sections connect the sensor (210) to the circuit carrier (220), and
a supply and read-out apparatus (225),
wherein respective contact points (235, 236) of a two of the conductor sections (230, 231) on the circuit carrier (220) are electrically connected together by a capacitor ($C_1$), with the result that the two conductor sections (230, 231), the capacitor ($C_1$) and the sensor (210) are constituent parts of an electrical loop ($L_1$),
the sensor device (200) also having a first electrical loop ($L_1$), which comprises the two conductor sections (230, 231) and the sensor (210), and having a second electrical loop ($L_2$) which comprises connection lines from the contact points to the capacitor ($C_1$), wherein the second electrical loop ($L_2$) is designed in such a manner that a current flow, which is generated in the second electrical loop ($L_2$) by a magnetic field (B) that permeates the first electrical loop ($L_1$) and the second electrical loop ($L_2$) at the same time, counteracts interference exerted on the output signal from the sensor by the magnetic field (B).

14. The sensor device (200) as claimed in claim 13, wherein the second electrical loop ($L_2$) comprises the capacitor ($C_1$).

15. The sensor device (200) as claimed in claim 13, also having a third electrical loop ($L_3$) which is designed in such a manner that a current flow, which is generated in the second and third electrical loops ($L_2$) by a magnetic field (B) that permeates the first loop ($L_1$), the second loop ($L_2$), and the third electrical loops ($L_3$) at the same time, counteracts interference exerted on the output signal from the sensor by the magnetic field (B).

* * * * *